United States Patent
Park

(10) Patent No.: US 9,197,475 B2
(45) Date of Patent: Nov. 24, 2015

(54) BASE BAND PROCESSOR WITH PEAK SUPPRESSION FUNCTION, TRANSMITTER WITH THE SAME AND METHOD OF TRANSMITTING SIGNAL

(75) Inventor: Young Seo Park, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 67 days.

(21) Appl. No.: 13/620,675

(22) Filed: Sep. 14, 2012

(65) Prior Publication Data

US 2013/0287145 A1 Oct. 31, 2013

(30) Foreign Application Priority Data

Apr. 27, 2012 (KR) .................. 10-2012-0044836

(51) Int. Cl.
*H04L 27/26* (2006.01)
*H04L 25/00* (2006.01)
*H03H 17/06* (2006.01)

(52) U.S. Cl.
CPC ............ *H04L 27/2624* (2013.01); *H04L 25/00* (2013.01); *H04L 27/2614* (2013.01); *H03H 17/0621* (2013.01)

(58) Field of Classification Search
CPC . H04L 27/2614; H04L 27/2623; H04L 25/00; H04L 25/02; H04L 2025/00; H04L 2025/02; H04L 27/2624
USPC .................................. 375/295–297, 285, 259
See application file for complete search history.

(56) References Cited

U.S. PATENT DOCUMENTS

| 5,287,387 A | 2/1994 | Birchler |
| 5,621,762 A | 4/1997 | Miller et al. |
| 5,638,403 A | 6/1997 | Birchler et al. |
| 7,522,071 B2* | 4/2009 | Caselli et al. .................... 341/50 |
| 2004/0052314 A1* | 3/2004 | Copeland ........................ 375/296 |
| 2009/0232249 A1* | 9/2009 | Hamano ......................... 375/295 |
| 2011/0092173 A1* | 4/2011 | McCallister et al. .......... 455/108 |
| 2013/0259159 A1* | 10/2013 | McCallister et al. .......... 375/297 |

FOREIGN PATENT DOCUMENTS

JP 2010-166619 A 7/2010

OTHER PUBLICATIONS

Korean Office Action issued in Korean Application No. 10-2012-0044836 dated Jul. 25, 2014, w/English translation.

* cited by examiner

*Primary Examiner* — Jean B Corrielus
(74) *Attorney, Agent, or Firm* — NSIP Law

(57) ABSTRACT

There are provided a base band processor having a peak suppression function, a transmitter, and a method of transmitting a signal. The base band processor includes: a signal generating unit generating digital signals; a variable up/down sampling unit changing a sampling rate in real time according to a magnitude of signal bandwidth changed in real time and sampling the digital signals from the signal generating unit according to the sampling rate; a peak suppression processing unit detecting peak power of sampled signals from the variable up/down sampling unit for a respective section in which a peak exists and suppressing corresponding peak power according to the peak power of the respective section; and a signal converting unit converting the digital signals from the peak suppression processing unit into analog signals.

16 Claims, 10 Drawing Sheets

BASE BAND PROCESSOR WITH PEAK SUPPRESSION FUNCTION, TRANSMITTER WITH THE SAME AND METHOD OF TRANSMITTING SIGNAL

CROSS-REFERENCE TO RELATED APPLICATIONS

This application claims the priority of Korean Patent Application No. 10-2012-0044836 filed on Apr. 27, 2012, in the Korean Intellectual Property Office, the disclosure of which is incorporated herein by reference.

BACKGROUND OF THE INVENTION

1. Field of the Invention

The present invention relates to a base band processor capable of being applied to OFDM-based communications systems and suppressing peak power of a transmission signal by using a variable sampling rate and window clipping, a transmitter with the same, and a method of processing a transmitting signal.

2. Description of the Related Art

Generally, one of the biggest defects of communication modulation applied to orthogonal frequency-division multiplexing (OFDM)-based communications systems, such as long term evolution (LTE), worldwide interoperability for microwave access (WiMax), and the like, is high peak to average power ratio (PAPR or PAR). The reason for this is that efficiency of a linear power amplifier may be degraded due to a high PAPR (or peak). Therefore, many PAPR suppression (or peak suppression) methods have been researched and developed over the last decades.

As a method, among existing PAPR suppression methods, that can be implemented most efficiently and easily, there is provided a method of window clipping. The PAPR suppression method can be applied to the OFDM-based communications systems without changing any protocol or a process of generating a standard signal.

However, in the latest OFDM-based communications systems, such as OFDMA, Single_Carrier_Frequency_Division_Multiple Access (SC-FDMA), and the like, a signal bandwidth may be changed in real time according to use environment. Therefore, the thickness of a typical peak signal may be seriously changed. However, when the window size is fixed as in the related art, the PAPR may not be efficiently suppressed.

In addition, when a bandwidth of a communication signal is wide, an original sampling rate of a signal may not be enough to measure the information of the peak signal in the OFDM-based communications systems. In this case, the efficiency of the window clipping method may be more seriously degraded.

On the other hand, when the bandwidth of the communication signal is narrow, the original sampling rate may be higher than needed. In this case, the sampling rate is to be reduced so as to reduce complexity of the window clipping without degrading performance.

Therefore, when the bandwidth of the communication signal is seriously changed in real time, problems of window size, inaccurate information detection of a peak signal, and complexity may occur.

Related Art Document 1 discloses "Low splatter peak-to-average signal reduction", which discloses that PAPR can be effectively suppressed while reducing spectrum distortion that is a general problem of -PAPR suppression. However, when the thickness of the peak signal is thin, the peak signal cannot be accurately measured due to the insufficient sampling rate and thus, the performance may be degraded.

Related Art Document 2 relates to "Low-splatter peak-to-average signal reduction with interpolation", which discloses a technical matter of interpolating a signal with peak and then, applying original window clipping, when the sampling rate is not sufficiently large. Therefore, the method can solve a problem that the sampling rate is not sufficient. However, in the OFDMA-based communications systems in which the bandwidth is changed in real time, such as in LTE, the problems of the window size or the too large or too small sampling rate cannot be solved in real time.

RELATED ART DOCUMENT (Document 1) U.S. Pat. No. 5,287,387
(Document 2) U.S. Pat. No. 5,638,403

SUMMARY OF THE INVENTION

An aspect of the present invention provides a base band processor capable of suppressing peak power of a transmission signal by using a variable sampling rate and window clipping, a transmitter with the same, and a method of processing a transmitting signal.

According to an aspect of the present invention, there is provided a base band processor, including: a signal generating unit generating digital signals; a variable up/down sampling unit changing a sampling rate in real time according to a magnitude of signal bandwidth changed in real time and sampling the digital signals from the signal generating unit according to the sampling rate; a peak suppression processing unit detecting peak power of sampled signals from the variable up/down sampling unit for a respective section in which a peak exists and suppressing the corresponding peak power according to the peak power of the respective section; and a signal converting unit converting the digital signals from the peak suppression processing unit into analog signals.

According to another aspect of the present invention, there is provided a transmitter, including: a signal generating unit generating digital signals; a variable up/down sampling unit changing a sampling rate in real time according to a magnitude of signal bandwidth changed in real time and sampling the digital signals from the signal generating unit according to the sampling rate; a peak suppression processing unit detecting peak power of sampled signals from the variable up/down sampling unit for a respective section in which a peak exists and suppressing the peak power of a corresponding sampled signals according to the peak power of the sampled signals; a signal converting unit converting the digital signals from the peak suppression processing unit into analog signals; and an RF processing unit converting the analog signals from the signal converting unit into RF signals.

The variable up/down sampling unit may compare a signal bandwidth changed in real time with a preset reference bandwidth to change the preset sampling rate in real time according to the compared results.

The variable up/down sampling unit may reduce the sampling rate according to the magnitude of bandwidth when the signal bandwidth is lower than a reference bandwidth and increase the sampling rate according to the magnitude of bandwidth when the signal bandwidth is higher than the reference bandwidth.

The peak suppression processing unit may include: a signal power calculator calculating power of each sampled signal from the variable up/down sampling unit; a local peak detector detecting the local peak power of the respective section in which the peak exists, in the power calculated by the signal power calculator; a suppression factor determiner determining a suppression factor according to the peak power of the respective section detected by the local peak detector; and a window clipper generating a clipping window according to the suppression factor from the suppression factor determiner and applying the clipping window to suppress the peak power of the corresponding sampled signals from the variable up/down sampling unit.

The suppression factor determiner may compare the peak power with the reference power and determine the suppression factor according to the compared results, when the peak power detected by the local peak detector is higher than the preset reference power.

The window clipper may adjust a size of the clipping window according to a thickness of the corresponding sampled signals with the peak so that distortion in spectrum is significantly reduced and degradation in performance at a bit error rate is significantly reduced.

According to another aspect of the present invention, there is provided a method of transmitting a signal, including: generating digital signals; changing a sampling rate in real time according to a magnitude of signal bandwidth changed in real time and sampling the digital signals from the generating of the digital signals according to the sampling rate; detecting peak power of sampled signals from the sampling of the digital signals, for a respective section in which a peak exists and suppressing the peak power of corresponding sampled signals according to the peak power of the sampled signals; and converting the digital signals from the suppressing of the peak power into analog signals.

In the sampling, the sampling may be performed by comparing a signal bandwidth changed in real time with a preset reference bandwidth to change the preset sampling rate in real time according to the compared results.

In the sampling, the sampling rate may be reduced according to the magnitude of bandwidth when the signal bandwidth is lower than a reference bandwidth and the sampling rate may be increased according to the magnitude of bandwidth when the signal bandwidth is higher than the reference bandwidth.

The suppressing of the peak power may include: calculating power of each sampled signal from the sampling; detecting the local peak power of the respective section in which the peak exists, in the power calculated by the signal power calculator; determining a suppression factor according to the peak power of the respective section detected in the detecting of the peak power; and generating a clipping window according to the suppression factor from the determining of the suppression factor and applying the clipping window to suppress the peak power of the corresponding sampled signals from the sampling.

In the determining of the suppression factor, the peak power may be compared with the reference power to determine the suppression factor according to the compared results, when the peak power detected in the detecting of the peak power is higher than the preset reference power.

In the applying of the clipping window, a size of the clipping window may be adjusted according to a thickness of the corresponding sampled signals with the peak so that distortion in spectrum is significantly reduced and degradation in performance at a bit error rate is significantly reduced.

The method of transmitting a signal may further include converting the analog signals from the converting of the signal into RF signals.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
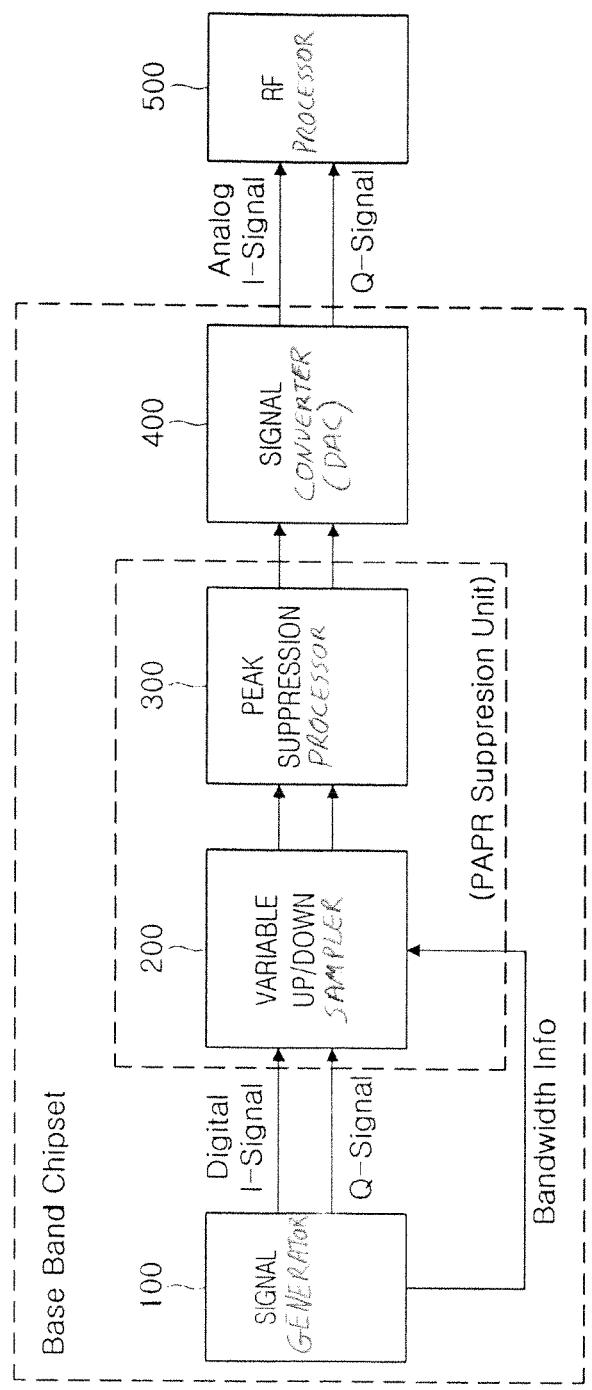
FIG. 1 is a block diagram of a transmitter according to a first embodiment of the present invention.

Hereinafter, embodiments of the present invention will be described with reference to the accompanying drawings.

The embodiments of the present invention are used to help understanding of the technical ideas of the present invention and therefore, the present invention is not limited to the described embodiments. Like reference numerals designate like components having substantially the same constitution and function in the drawings of the present invention.

FIG. 1 is a block diagram of a transmitter according to a first embodiment of the present invention.

Referring to FIG. 1, the transmitter according to the first embodiment of the present invention may be applied to OFDM-based communications systems using subcarriers and may include a base band processor and an RF processing unit 500.

The base band processor according to the embodiment of the present invention may include: a signal generating unit 100 generating digital signals; a variable up/down sampling unit 200 changing a sampling rate (SR) in real time according to a magnitude of a signal bandwidth changed in real time and sampling the digital signals from the signal generating unit 100 according to the sampling rate (SR); a peak suppression processing unit 300 detecting peak power (PPL) of the sampled signal from the variable up/down sampling unit 200 for each section in which peaks exist and suppressing the peak power of the corresponding sampled signal according to the peak power (PPL), and a signal converting unit 400 converting the digital signals from the peak suppression processing unit 300 into analog signals.

In addition, the RF processing unit 500 may be configured to convert the analog signals from the signal converting unit 400 into RF signals.

In this case, referring to FIG. 1, the signal generating unit 100 may generate digital signals including data to be transmitted. In this case, the signal generating unit 100 may supply information regarding a signal bandwidth in real time.

The variable up/down sampling unit 200 may change the sampling rate (SR) in real time according to the signal bandwidth changed in real time and sample the digital signals from the signal generating unit 100 according to the sampling rate (SR).

That is, the variable up/down sampling unit 200 shown in FIG. 1 may sample input digital signals (including an I signal and a Q signal) based on the magnitude of signal bandwidth from the signal generating unit 100 so as not to have too high sampling rate, for significantly reduced complexity while having accurate peak information. Here, the peak information may include the peak power and a peak position.

In this case, in connection with the sampling rate, the variable up/down sampling unit 200 compares a signal bandwidth (BW) changed in real time with a preset reference bandwidth to change the preset sampling rate (SR) in real time according to the compared results.

In detail, the variable up/down sampling unit 200 may reduce the sampling rate (SR) according to the magnitude of bandwidth when the signal bandwidth is lower than a reference bandwidth and may increase the sampling rate (SR) according to the magnitude of bandwidth when the signal bandwidth is higher than the reference bandwidth.

For example, the transmitter according to the embodiment of the present invention indicates an LTE uplink. In this case, the transmitter may use 72 through 1320 subcarriers. Here, 72 subcarriers are 6 resource blocks and may correspond to a bandwidth of 1.08 MHz. Further, 1320 subcarriers are 110 resource blocks and may correspond to a bandwidth of 19.8 MHz. However, a signal having 72 subcarriers does not require 2040 samples per a symbol, unlike a signal having 1320 subcarriers.

On the other hand, the signal having 1320 subcarriers needs about 8192 samples per a symbol so as to accurately detect the peak information and therefore, the sampling rate may rise and fall according to the number of used subcarriers so as to improve the PAPR suppression performance in the window clipping.

The peak suppression processing unit 300 may detect the peak power (PPL) of sampled signals from the variable up/down sampling unit 200 for each section in which peaks exist and suppress the peak power of the corresponding sampled signals according to the peak power (PPL).

Further, the signal converting unit 400 may convert the digital signals from the peak suppression processing unit 300 into the analog signals.

In addition, the RF processing unit 50 may be configured to convert the analog signals from the signal converting unit 400 into the RF signals depending on preset communication protocols for wireless transmission.

Figure 2:
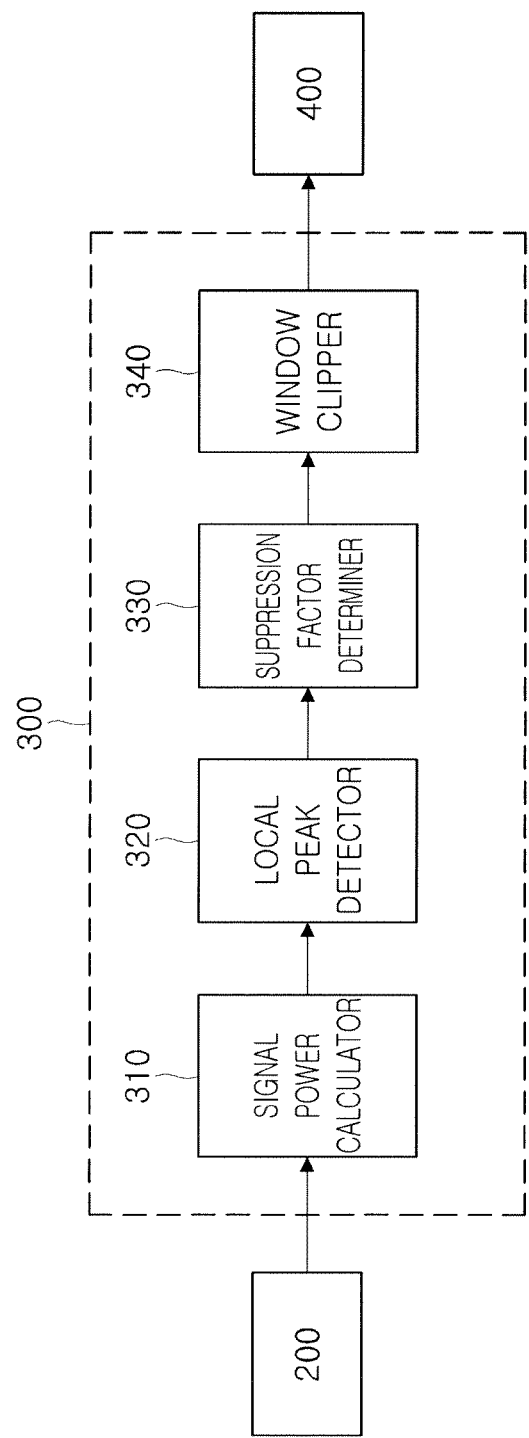
FIG. 2 is a block diagram of a peak suppression processing unit according to the first embodiment of the present invention.

FIG. 2 is a block diagram of the peak suppression processing unit according to the first embodiment of the present invention.

Referring to FIG. 2, the peak suppression processing unit 300 may include: a signal power calculator 310 calculating power of each sampled signal from the variable up/down sampling unit 200; a local peak detector 320 detecting the peak power (PPL) for each section in which peaks exist, in the power calculated by the signal power calculator 310; a suppression factor determiner 330 determining a suppression factor (SF) according to each peak power (PPL) for each of the plurality of sections detected by the local peak detector 320; and a window clipper 340 generating a clipping window (CW) according to the suppression factor (SF) from the suppression factor determiner 330 and applying the clipping window (CW) to suppress the peak power of the corresponding sampled signals from the variable up/down sampling unit 200.

In this case, referring to FIGS. 1 and 2, the signal power calculator 310 may calculate power of each sampled signal from the variable up/down sampling unit 200. That is, power (PL) for the I signal (SI) and the Q signal (SQ) included in sampled signals can be obtained according to the following Equation 1.

$$PL=(SI)^2+(SQ)^2 \quad \text{[Equation 1]}$$

The local peak detector 320 may detect the peak power (PPL) for each section in which peaks exist, in the power (PL) of each of sampled signals calculated by the signal power calculator 310. Here, the section refers to a section having only one peak.

The suppression factor determiner 330 may determine the suppression factor (SF) according to the size of the peak power (PPL) for each section detected by the local peak detector 320. The suppression factor may be obtained according to the following Equation 2. Here, when the peak power is relatively large, the suppression factor is large accordingly.

For example, the suppression factor determiner 330 may compare the peak power (PPL) with the reference power and determine the suppression factor (SF) according to the compared results, when the peak power (PPL) detected by the local peak detector 320 is higher than the preset reference power. When applying the suppression factor (SF), the signal may be converted according to the following Equation 2.

$$\text{Signal}=\text{Signal}*(1-CW*SF)$$

$$SF=1-\sqrt{CP/PPL}, CP\text{:clipping parameter} \quad \text{[Equation 2]}$$

Further, the window clipper 340 may generate the clipping window (CW) according to the suppression factor (SF) from the suppression factor determiner 330 and apply the clipping window (CW) to suppress the peak power of corresponding sampled signals from the variable up/down sampling unit 200. For example, the peak power of each section may be suppressed by multiplying the clipping window (CW) by sampled signals.

In this case, the window clipper 340 may adjust the size of the clipping window CW according to the thickness of the corresponding sampled signals with the peak so that distortion in spectrum may be significantly reduced and the degradation in performance at a bit error rate may be significantly reduced. Here, the thickness of sampled signals refers to a period of time during which average power rises to the peak power and then, falls to the average power. When the time is represented graphically on a time base, this is denoted by how sharp the peak signal is or thick the peak signal is.

For example, when the thickness of the corresponding sampled signals with the peak is thick, the size of the clipping window (CW) may be increased according to the degree of the thickness, while when the thickness of the corresponding sampled signal with the peak is relatively low, the size of the clipping window CW may be small according to the thin degree of the thickness.

As described above, in this case, the sampled signal with the peak is reduced largest in consideration of characteristics of the window, sampled signals of both sides of the sampled signal with the peak are reduced to be second largest, and sampled signals of both sides thereof are reduced to be lower than this. As described above, all sampled signals entering the section of the window are slightly reduced in response thereto and thus, the sudden deformation of the signal may be prevented and the deformation of the spectrum may be significantly reduced.

Figure 3:
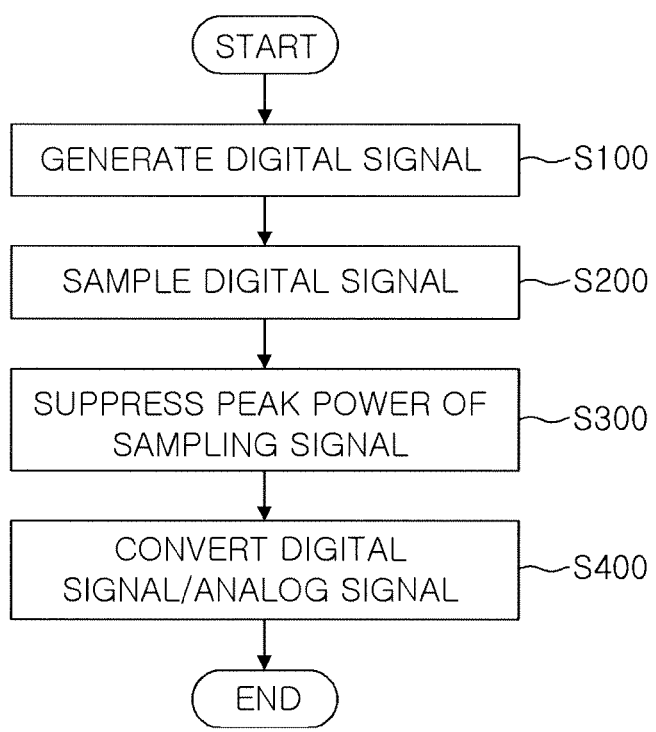
FIG. 3 is a flow chart of a transmitting method according to a second embodiment of the present invention.

FIG. 3 is a flow chart of a transmitting method according to a second embodiment of the present invention.

Referring to FIG. 3, the transmitting method according to the second embodiment of the present invention may include: generating the digital signals (S100); changing the sampling rate (SR) in real time according to the magnitude of the signal bandwidth changed in real time and sampling the digital signals from the generating of the digital signals (S100) according to the sampling rate (SR) (S200); detecting the peak power (PPL) of the sampled signals from the sampling (S200) for each section in which peaks exist and suppressing the peak power of the corresponding sampled signals according to the peak power (PPL) for each section (S300), and converting the digital signals from the suppressing of the peak power (S300) into analog signals (S400).

In this case, referring to FIGS. 1 and 3, in the generating of the digital signals (S100) of FIG. 3, the digital signals including the data to be transmitted may be generated by the signal generating unit 100 shown in FIG. 1.

Next, in the sampling of the digital signals (S200) of FIG. 3, the sampling rate (SR) may be changed in real time according to the magnitude of the signal bandwidth changed in real time and the digital signals from the generating of the digital signals (S100) may be sampled according to the sampling rate (SR), by the variable up/down sampling unit 200 shown in FIG. 1.

In this case, in the sampling (S200), the preset sampling rate (SR) may be changed in real time according to the results obtained by comparing the signal bandwidth changed in real time with the preset reference bandwidth.

For example, in the sampling (S200), the sampling rate (SR) may be reduced according to the magnitude of bandwidth when the signal bandwidth is lower than a reference bandwidth and the sampling rate (SR) may be increased according to the magnitude of bandwidth when the signal bandwidth is higher than the reference bandwidth.

Next, in the suppressing of the peak power (S300) of FIG. 3, the peak power (PPL) of the sampled signals from the sampling (S200) may be detected for each section in which peaks exist and the peak power of the corresponding sampled signals may be suppressed according to the peak power (PPL) for each section, by the peak suppression processing unit 300 shown in FIG. 1.

Next, in the converting of the signals (S400) of FIG. 3, the digital signals from the suppressing of the peak power (S300) may be converted into the analog signals by the signal converting unit 400 shown in FIG. 1.

As described above, in the sampling (S200) of the embodiment of the present invention, the sampling rate (SR) may be changed in real time according to the magnitude of signal bandwidth changed in real time, which will be described with reference to FIGS. 4 and 5.

Figure 4:
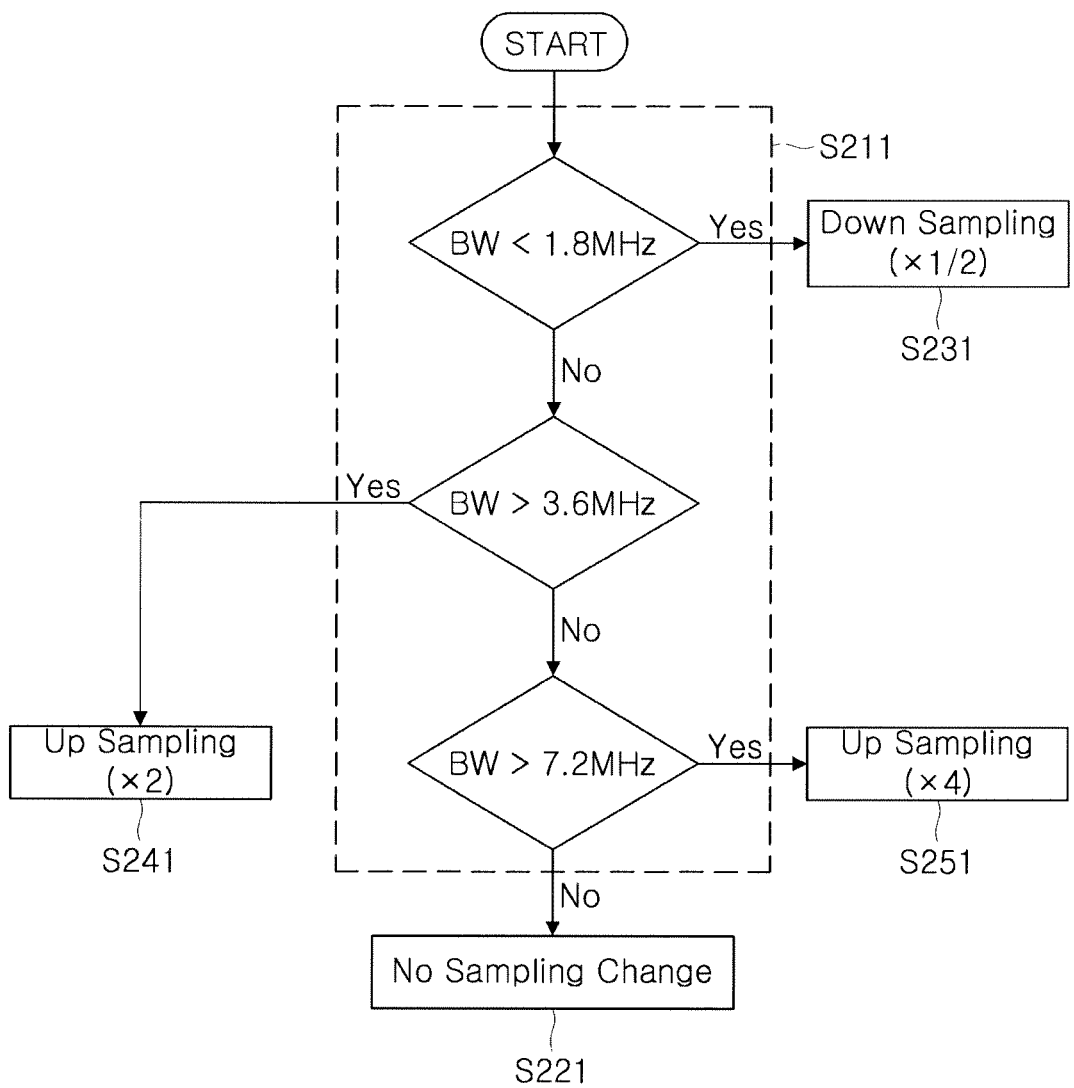
FIG. 4 is a diagram showing a first variable order of a sampling rate according to an embodiment of the present invention.

FIG. 4 is a diagram showing a first variable order of a sampling rate according to an embodiment of the present invention.

Referring to FIG. 4, a communications device to which the embodiment of the present invention is applied first compares the bandwidths with each other (S211) in the sampling (S200) when a communication band is 10 MHz band LTE, does not change the sampling rate when the signal bandwidth is included in a preset range of 1.8 MHz through 3.6 MHz (S221), halves the sampling rate when the communication band is lower than 1.8 MHz (S231), doubles the sampling rate (*2) when the communication band is included in a range of 3.6 MHz through 7.2 MHz (S241), and quadruples the sampling rate (*4) when the communication band is higher than 7.2 MHz (S251).

That is, when a basic sampling rate in the 10 MHz band LTE is 1024 per a symbol, the sampling rate is halved when the bandwidth is lower than 1.8 MHz and is down-sampled to 512 per a symbol. In addition, when the bandwidth is higher than 3.6 MHz and lower than 7.2 MHz, the sampling rate may be doubled and may be up-sampled to 2048 per a symbol and when the bandwidth is higher than 7.2 MHz, the sampling rate may be quadrupled and may be up-sampled to 4096 per a symbol. When the bandwidth is in a range of 1.8 MHz through 3.6 MHz, the sampling rate may use 1024 as it is without being changed.

Figure 5:
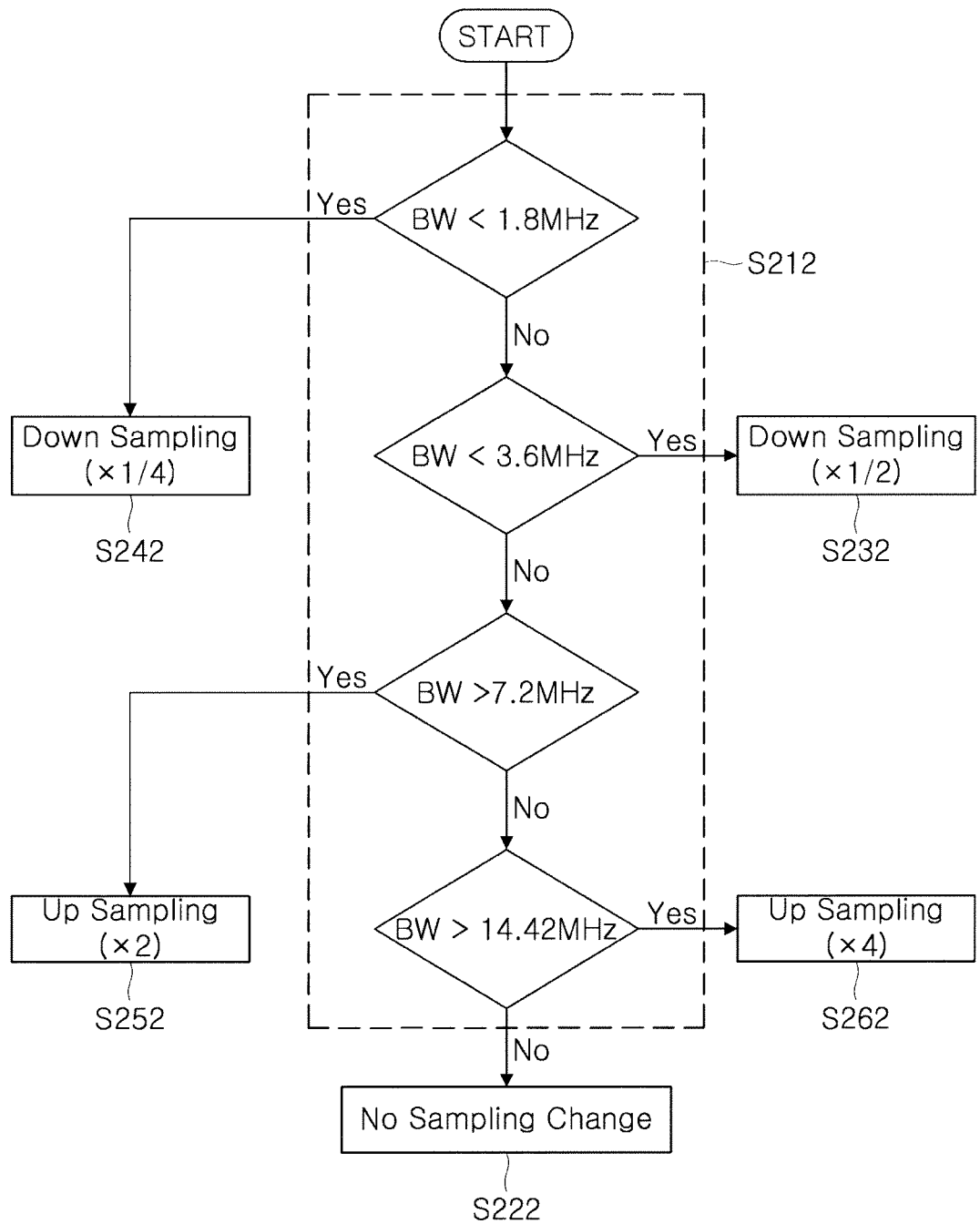
FIG. 5 is a diagram showing a second variable order of the sampling rate according to the embodiment of the present invention.

FIG. 5 is a diagram showing a second variable order of the sampling rate according to the embodiment of the present invention. Referring to FIG. 5, the communications device to which the embodiment of the present invention is applied first compares the bandwidths with each other (S212) in the sampling (S200) when the communication band is 20 MHz band LTE, does not change the sampling rate when the signal bandwidth is included in a preset range of 3.6 MHz through 7.2 MHz (S222), halves the sampling rate when the communication band is included in a range of 1.8 MHz through 3.6 MHz (S232), quarters the sampling rate when the communication band is lower than 3.6 MHz (S242), and doubles the sampling rate (*2) when the communication band is included in a range of 7.2 MHz through 14.4 MHz, and quadruples the sampling rate (*4) when the communication band is higher than 14.4 MHz (S252).

That is, when the basic sampling rate in the 20 MHz band LTE is 2048 per a symbol, the uplink signal generally has even lower bandwidth. Therefore, when the bandwidth is lower than 1.8 MHz, the sampling rate is quartered and is down-sampled to 512 per a symbol. In addition, when the bandwidth is higher than 1.8 MHz but lower than 3.6 MHz, the sampling rate is halved and is down-sampled to 1024 per a symbol. On the other hand, when the bandwidth is higher than 7.2 MHz and lower than 14.4 MHz, the sampling rate is doubled and is up-sampled to 4096 per a symbol and when the bandwidth is higher than 14.4 MHz, the sampling rate is quadrupled and is up-sampled to 8192. Further, when the bandwidth is in a range of 3.6 MHz to 7.2 MHz, the sampling rate may use 2048 as it is without being changed.

Figure 6:
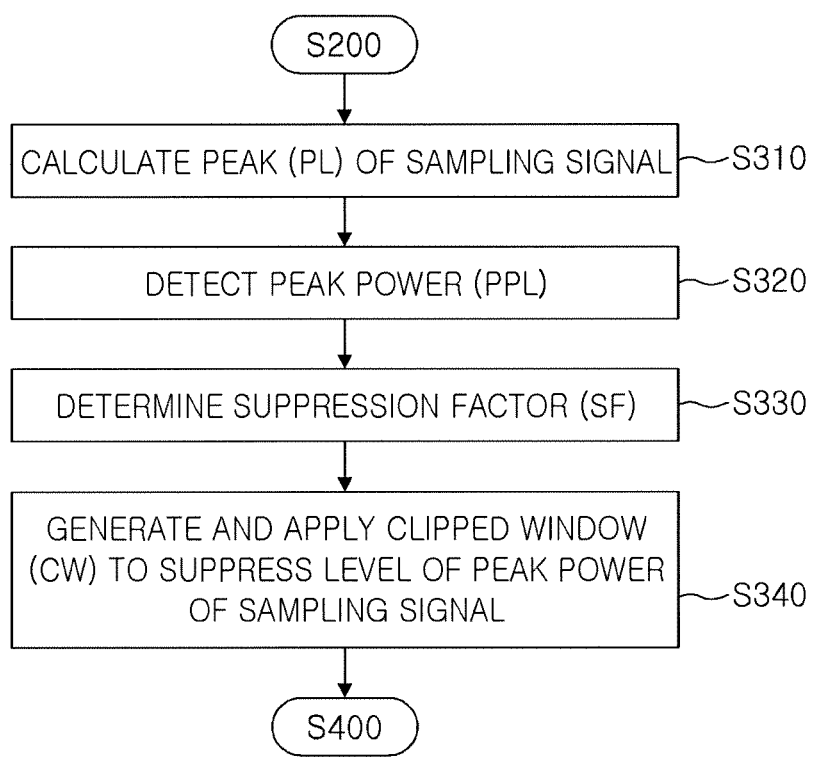
FIG. 6 is a flow chart of peak power suppression according to the embodiment of the present invention.

FIG. 6 is a flow chart of peak power suppression according to the embodiment of the present invention.

Referring to FIG. 6, the suppressing of the peak power (S300) may include: calculating power of each sampled signal (S310) from the sampling (S200); detecting the peak power (PPL) (S320) for each section in which peaks exist in the power calculated by the signal power calculator (S310); determining a suppression factor (SF) (S330) according to each peak power (PPL) for each of the plurality of sections detected in the detecting of the peak power (S320); and generating the clipping window (CW) (S340) according to the suppression factor (SF) from the determining of the suppressing factor and applying the clipping window (CW) to suppress the peak power of a corresponding sampled signal from the sampling (S200).

In this case, referring to FIGS. 2 and 6, in the calculating of the peak (PL) of the sampling signal (S310) of FIG. 6, power of each sampled signal from the sampling (S200) may be calculated by the signal power calculator 310 shown in FIG. 2.

Next, in the detecting of the peak power (PPL) (S320) of FIG. 6, the local peak detector 320 shown in FIG. 2 may detect the peak power (PPL) for each section in which peaks exist, in the power calculated by the signal power calculator (S310).

Next, in the determining of the suppression factor (S330) of FIG. 6, the suppression factor (SF) may be determined according to each of the peak power (PPL) for each of the plurality of sections detected in the detecting of the peak power (S320) by the suppression factor determiner 330 shown in FIG. 2.

In more detail, in the determining of the suppression factor (S330), the suppression factor (SF) may be determined according to the results obtained by comparing the peak power (PPL) with the reference power when the peak power (PPL) detected in the detecting of the peak power (S320) is higher than the preset reference power.

In the applying of the clipping window (S340) of FIG. 6, the clipping window (CW) may be generated according to the suppression factor (SF) from the determining of the suppression factor (S330) by the window clipper 400 shown in FIG. 2 and the peak power of the sampled signals from the sampling (S200) may be suppressed by applying the clipping window (CW).

For example, in the applying of the clipping window (S340), the size of the clipping window (CW) may be adjusted according to the thickness of the corresponding sampled signal having the peak so as to significantly reduce the distortion in the spectrum and the degradation in performance in the bit error ratio.

As described above, the transmitting method according to the second embodiment of the present invention may include converting the analog signals from the converting of the signal (S400) into the RF signals (S500).

In this case, in the converting of the analog signals into the RF signals (S500) of FIG. 6, the analog signals from the converting of the signal (S400) may be converted into the RF signals according to the preset communication protocols.

Figure 7:
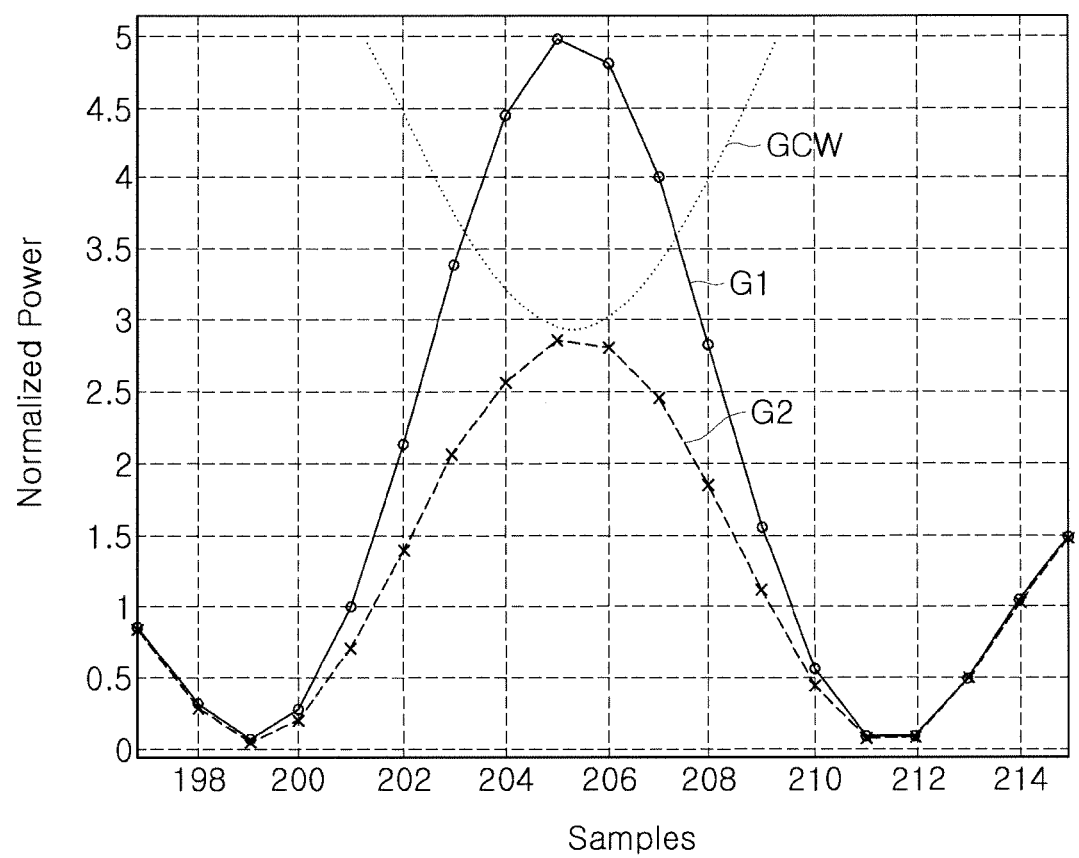
FIG. 7 is a graph for describing window clipping according to the embodiment of the present invention.

FIG. 7 is a graph for describing the window clipping according to the embodiment of the present invention.

Referring to FIG. 7, in the applying of the clipping window (S340), when the window clipping is applied, a sampled signal G1 having peak is smoothly suppressed so as to be a required signal G2. Here, the window size in a clipping window (GCW) may be adjusted according to the thickness of the sampled signals with peaks so as to significantly reduce the distortion in the spectrum and the degradation in performance in the bit error ratio (BER).

In addition, the PAPR suppression performance depends on peak amplitude information and peak position information and may depend on peak amplitude information due to the calculation of the difference value of the peak amplitude and the required reference amplitude. In addition, the PAPR suppression performance may depend on the peak position information. The reason for this is that accurate peak information significantly reduces signal distortion.

Figure 8:
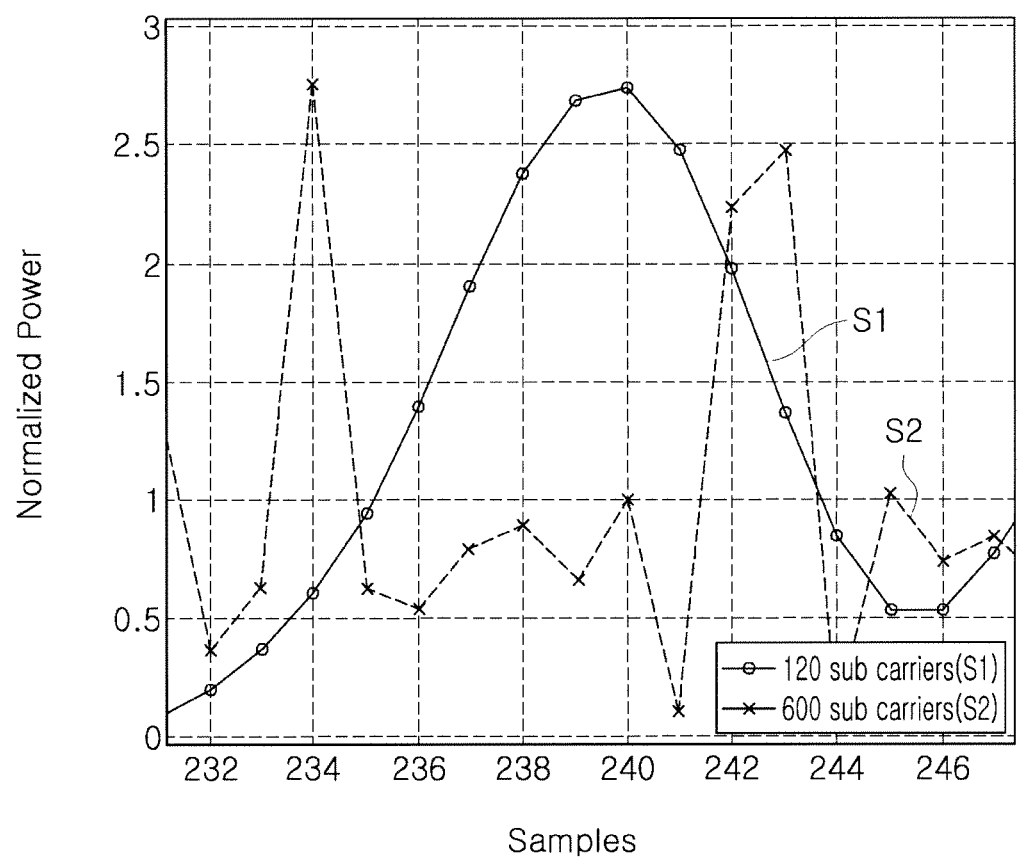
FIG. 8 is a graph for describing a fixing sampling rate for signals with different bandwidths.

FIG. 8 is a graph for describing a fixing sampling rate for signals with different bandwidths. Referring to FIG. 8, G1 in FIG. 8 shows an example of the thick peak signal of the small bandwidth having 120 subcarriers in the uplink channel in the 10 MHz band LTE, and G2 is an example of a thin peak signal of a maximum bandwidth having 600 subcarriers in the uplink channel in the 10 MHz band LTE.

In FIG. 8, in the case of the G2, when the sampling rate is not sufficiently high, the accurate peak power and the positional information cannot be accurately measured.

Figure 9:
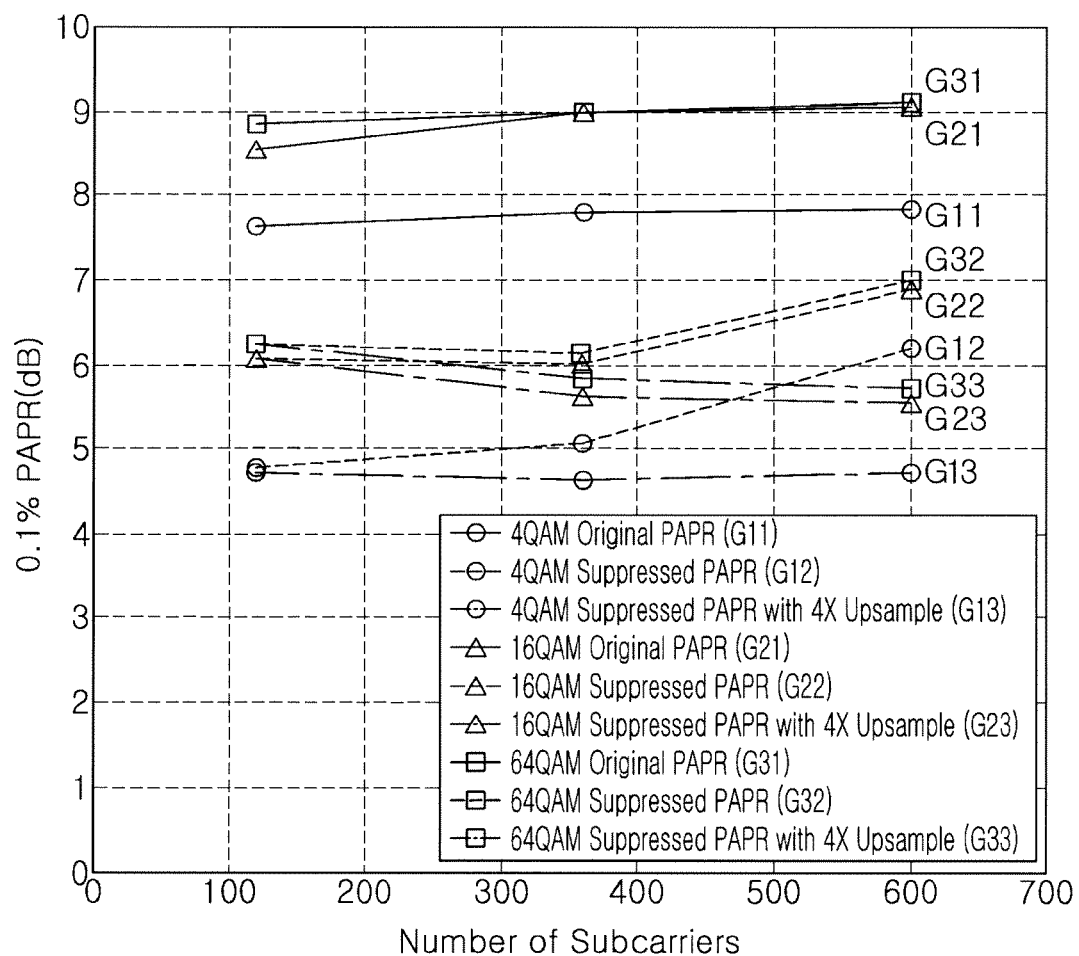
FIG. 9 is a graph showing PAPR and a sampling rate increase effect when a bandwidth is large.

FIG. 9 is a graph showing PAPR and a sampling rate increase effect when a bandwidth is relatively large.

Referring to FIG. 9, in the transmitter to which 4QAM, 16QAM, and 64QAM are applied, an original PAPR for each sampled signal is as shown in G11, G21, and G31.

In FIG. 9, in the PAPR suppression performance, PAPR may be reduced as shown in G12, G22, and G32 of FIG. 9 when the bandwidth of the sampled signal is large (here, 600). However, it may be appreciated that when the sampling rate is sufficient by being quadrupled as in G13, G23, and G33 of FIG. 9, the PAPR may again be normalized.

Figure 10:
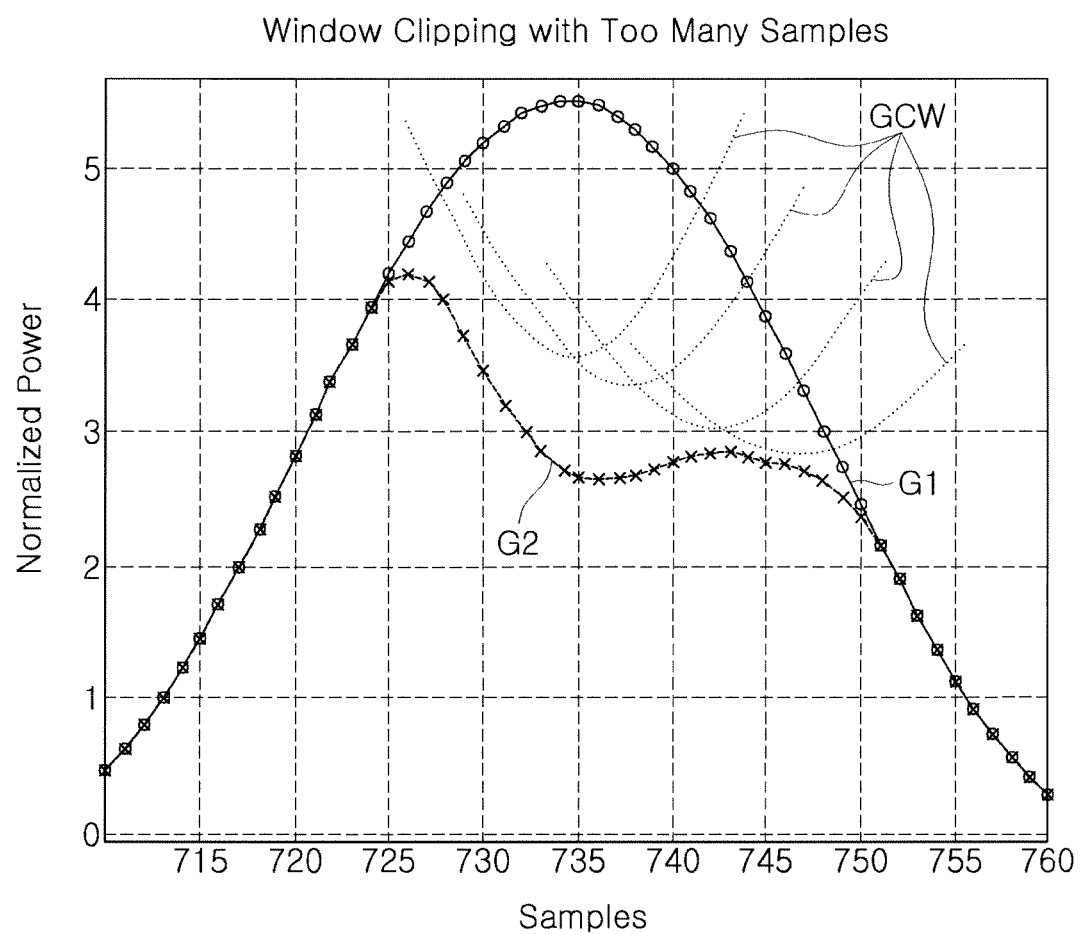
FIG. 10 is a diagram for describing a peak suppression effect of a large sampling rate when a bandwidth is small.

FIG. 10 is a diagram for describing a peak suppression effect of a large sampling rate when a bandwidth is relatively small.

Referring to FIG. 10, when the signal bandwidth is small and the sampling rate is too large, the complexity of calculation may be increased more than is necessary.

For example, in severe cases, as shown in FIG. 10, it may be appreciated from the graph G1 of the sampled signal and the graph (GCW) of the clipping window that the PAPR suppression performance is reduced when the window size is relatively too lower than the thickness of the sampled signal.

That is, the window clipping starts from the peak center of the sampled signal and therefore, as shown in FIG. 10, component G2 of a portion of the sampled signal may be suppressed but a left peak component of the sampled signal may not be completely suppressed.

As set forth above, according to the embodiments of the present invention, the peak power of the transmitting signal may be suppressed by using the variable sampling rate and the window clipping.

That is, according to the embodiments of the present invention, the problems of clipping window size, inaccurate peak signal information, and complexity when a signal bandwidth is changed in real time may be solved, and the window size may be automatically changed so as to meet the thickness of sample signals with peaks according to the change in the sampling rate by changing the sampling rate based on the currently used signal bandwidth prior to applying the window clipping. On the other hand, according to the embodiments of the present invention, the complexity of algorithm calculation may be reduced by the down sampling.

While the present invention has been shown and described in connection with the embodiments, it will be apparent to those skilled in the art that modifications and variations may be made without departing from the spirit and scope of the invention as defined by the appended claims.

What is claimed is:

1. An apparatus, comprising
a processor configured to perform following functions including:
generating digital signals;
changing a sampling rate in real time according to a magnitude of signal bandwidth changed in real time into an adjusted sampling rate and sampling the digital signals according to the adjusted sampling rate;
detecting peak power of the sampled signals for a respective section in which a peak exists and suppressing corresponding peak power according to the peak power of the respective section to produce adjusted peak adjusted digital signals;
converting the peak adjusted digital signals into analog signals;
comparing the signal bandwidth changed in real time with a preset reference bandwidth, wherein the sampling rate is further changed in real time according to the compared results.

2. The apparatus of claim 1, wherein the processor is further configured to reduce the sampling rate according to the magnitude of signal bandwidth, when the signal bandwidth is lower than the preset reference bandwidth and increase the sampling rate according to the magnitude of signal bandwidth, when the signal bandwidth is higher than the preset reference bandwidth.

3. The apparatus of claim 1, wherein the processor is further configured to:

calculate power of each sampled signal;
detect the peak power of a respective section in which the peak exists, in the calculated power;
determine a suppression factor according to the peak power of the respective section; and
generate a clipping window according to the suppression factor and apply the clipping window to suppress the peak power of the corresponding sampled signals.

4. The apparatus of claim 3, wherein the processor is further configured to compare the peak power with a preset reference power and determine the suppression factor according to a result of the comparison between the peak power and preset reference power, when the peak power is higher than the preset reference power.

5. The apparatus of claim 4, wherein the processor is further configured to adjust a size of the clipping window according to a thickness of the corresponding sampled signals with the peak, so that a distortion in an in-band spectrum is significantly reduced and a degradation in performance at a bit error rate is significantly reduced, wherein, the thickness of the corresponding sampled signals with the peak, refers to a period of time during which average power rises to the peak power and then, falls to the average power.

6. A transmitter, comprising
a processor configured to perform the following functions of:
generating digital signals;
changing a sampling rate in real time according to a magnitude of signal bandwidth changed in real time into an adjusted sampling rate and sampling the digital signals according to the adjusted sampling rate;
detecting peak power of the sampled signals for a respective section in which a peak exists and suppressing the peak power of a corresponding sampled signal according to the peak power of the sampled signals to produce peak adjusted digital signals;
converting the peak adjusted digital signals into analog signals;
converting the analog signals into radio frequency (RF) signals; and
comparing the signal bandwidth changed in real time with a preset reference bandwidth, wherein the sampling rate is further changed in real time according to the compared results.

7. The transmitter of claim 6, wherein the processor is further configured to reduce the sampling rate according to the magnitude of signal bandwidth when the signal bandwidth is lower than the preset reference bandwidth and increase the sampling rate according to the magnitude of signal bandwidth, when the signal bandwidth is higher than the preset reference bandwidth.

8. The transmitter of claim 6, wherein the processor is further configured to:
calculate power of each sampled signal;
detect the local peak power of the respective section in which the peak exists, in the calculated power;
determine a suppression factor according to the peak power of the respective section; and
generate a clipping window according to the suppression factor and apply the clipping window to suppress the peak power of the corresponding sampled signals.

9. The transmitter of claim 8, wherein the processor is further configured to compare the peak power with a preset reference power and determine the suppression factor according to a result of the comparison between the peak power and the preset reference power, when the peak power detected by the local peak detector is higher than the preset reference power.

10. The transmitter of claim 9, wherein the processor is further configured to adjust a size of the clipping window according to a thickness of the corresponding sampled signals with the peak, so that a distortion in an in-band spectrum is significantly reduced and a degradation in performance at a bit error rate is significantly reduced.

11. A method of transmitting a signal, comprising:
generating digital signals;
changing a sampling rate in real time into an adjusted sampling rate according to a magnitude of signal bandwidth changed in real time and sampling the digital signals from the generating of the digital signals according to the adjusted sampling rate;
detecting peak power of sampled signals from the sampling of the digital signals, for a respective section in which a peak exists and suppressing the peak power of corresponding sampled signals according to the peak power of the sampled signals; and
converting the digital signals from the suppressing of the peak power into analog signals,
wherein the sampling is performed by comparing a signal bandwidth changed in real time with respect to a preset reference bandwidth to a preset sampling rate changed in real time according to compared results.

12. The method of claim 11, wherein in the sampling, the sampling rate is reduced according to the magnitude of signal bandwidth when the signal bandwidth is lower than the preset reference bandwidth and the sampling rate is increased according to the magnitude of signal bandwidth when the signal bandwidth is higher than the preset reference bandwidth.

13. The method of claim 11, wherein the suppressing of the peak power includes:
calculating power of each sampled signal from the sampling;
detecting the local peak power of the respective section in which the peak exists, in the power calculated in calculation of the peak power;
determining a suppression factor according to the peak power of the respective section detected in the detecting of the peak power; and
generating a clipping window according to the suppression factor from the determining of the suppression factor and applying the clipping window to suppress the peak power of the corresponding sampled signals from the sampling.

14. The method of claim 13, wherein in the determining of the suppression factor, the peak power is compared with a preset reference power to determine the suppression factor according to a result of the comparison between the peak power and the preset reference power, when the peak power detected in the detecting of the peak power is higher than the preset reference power.

15. The method of claim 14, wherein in applying the clipping window, a size of the clipping window is adjusted according to a thickness of the corresponding sampled signals with the peak, so that a distortion in an in-band spectrum is significantly reduced and a degradation in performance at a bit error rate is significantly reduced.

16. The method of claim 11, further comprising converting the analog signals from the converting of the signal into Radio Frequency (RF) signals.

* * * * *